United States Patent
Liu et al.

(10) Patent No.: US 8,339,175 B2
(45) Date of Patent: Dec. 25, 2012

(54) PHASE GENERATING APPARATUS AND METHOD THEREOF

(75) Inventors: Hsian-Feng Liu, Hsinchu Hsien (TW); Sterling Smith, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 89 days.

(21) Appl. No.: 12/957,524

(22) Filed: Dec. 1, 2010

(65) Prior Publication Data

US 2011/0128061 A1 Jun. 2, 2011

(30) Foreign Application Priority Data

Dec. 2, 2009 (TW) .............................. 98141134 A (51) Int. Cl.
*H03K 3/00* (2006.01)
(52) U.S. Cl. ......... 327/298; 327/231; 327/233; 327/299
(58) Field of Classification Search .......... 327/113–115, 327/117, 231, 233–234, 237, 296–299
See application file for complete search history.

(56) References Cited

U.S. PATENT DOCUMENTS

| | | | | |
|---|---|---|---|---|
| 6,392,462 B2 * | 5/2002 | Ebuchi et al. | ................. | 327/295 |
| 6,977,539 B1 * | 12/2005 | McDonagh et al. | .......... | 327/295 |
| 8,106,691 B2 * | 1/2012 | Sogawa et al. | ................ | 327/156 |
| 2011/0286510 A1 * | 11/2011 | Levantino et al. | ............ | 375/226 |

* cited by examiner

*Primary Examiner* — An Luu
(74) *Attorney, Agent, or Firm* — Edell, Shapiro & Finnan, LLC (57) ABSTRACT

A phase generating apparatus generates an output clock having a desired phase according to a digital signal. The apparatus includes a phase selecting unit and a phase generating unit. The phase selecting unit selects one of a plurality of input clocks according to a portion of bits of the digital signal to generate a reference clock. Each of the input clocks respectively has a difference phase. The phase selecting unit divides the frequency of the reference clock, and selectively delays the frequency-divided reference clock according to another portion of bits of the digital signal to generate the output clock.

12 Claims, 8 Drawing Sheets

Figure 1:
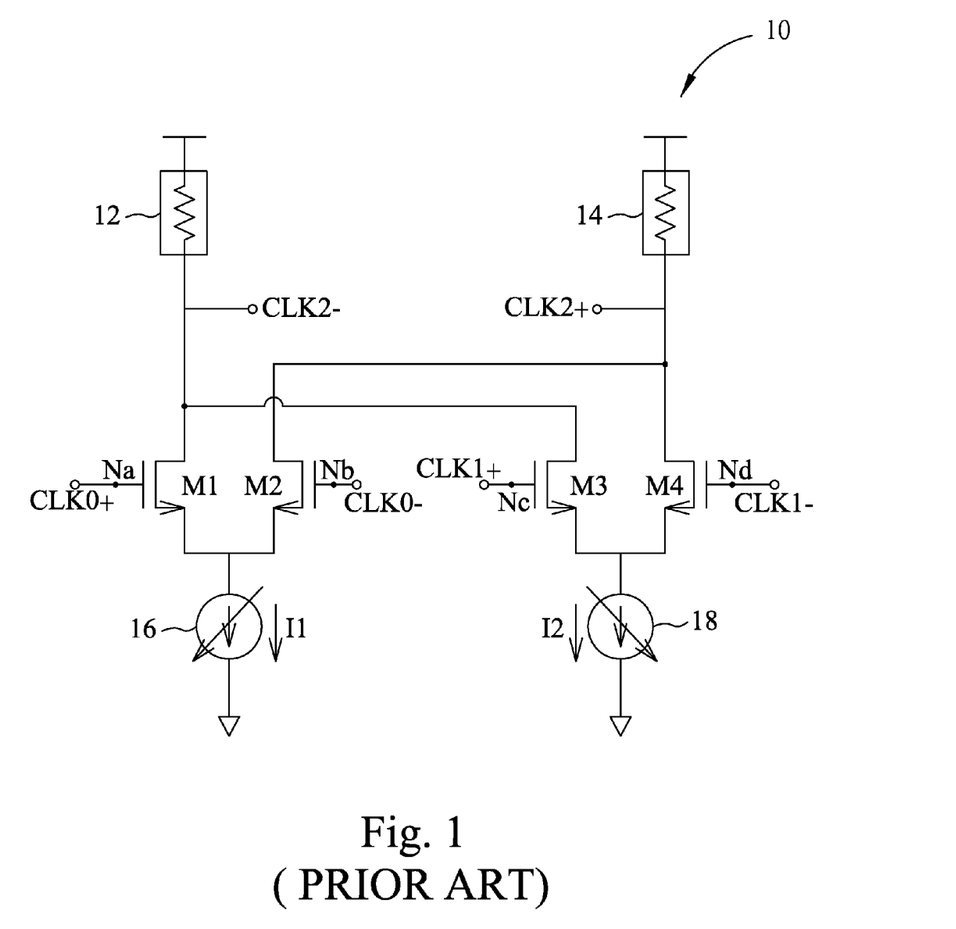
FIG. 1 is a schematic diagram of a conventional phase generator.
Figure 2:
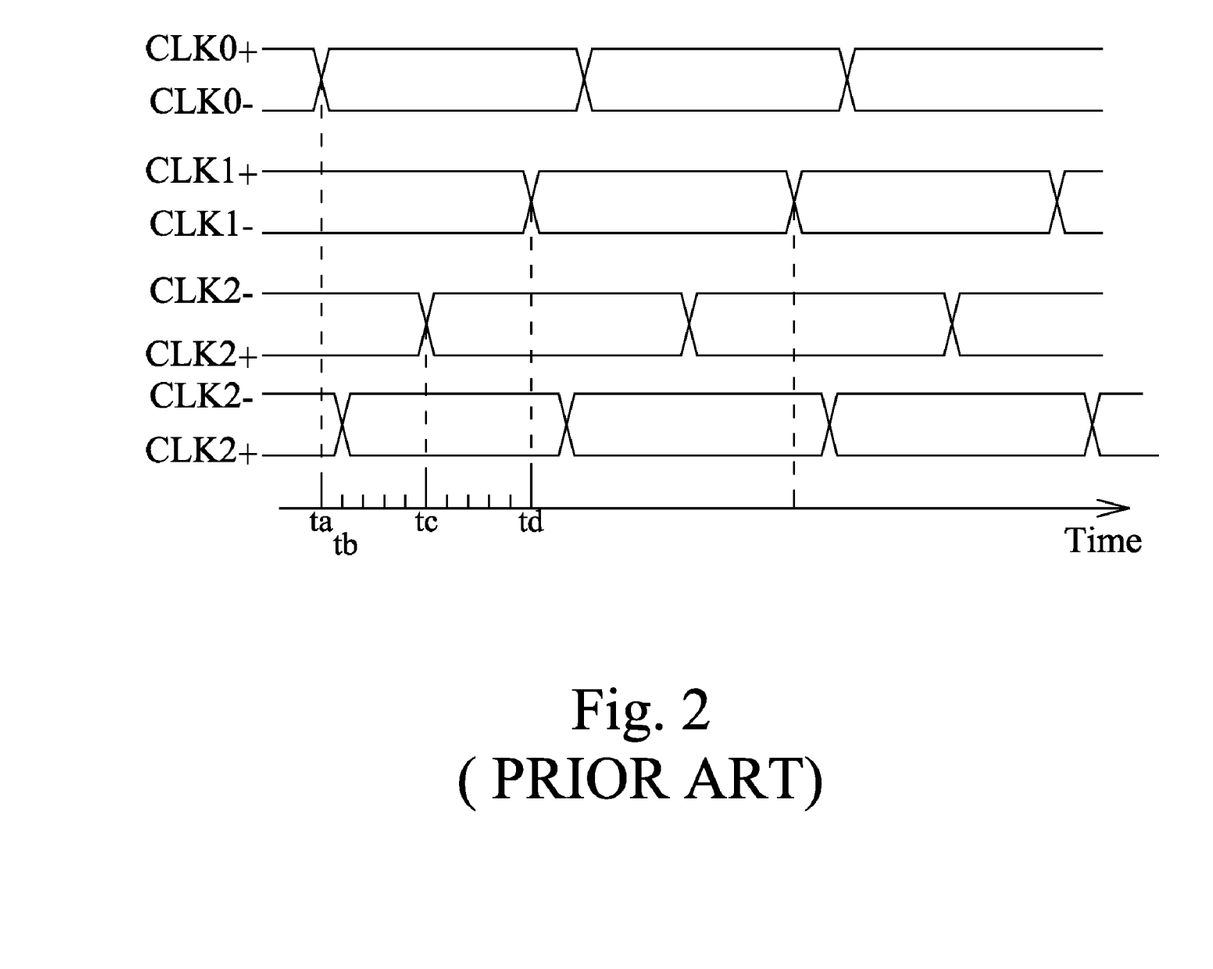
FIG. 2 is schematic diagram of a timing sequence of a differential input clock and an output clock generated by the phase generator in FIG. 1.

Fig. 8 ative input clock (CLK0+, CLK0−) and a second differential input current I1 gets larger. In contrast, the phase of the output clock (CLK2+, CLK2−) becomes more approximate to that of the second differential input clock (CLK1+, CLK1−) as the second current I2 gets larger, and so on. Accordingly, when the first current I1 and the second current I2 are divided into ten equal portions, the phase generator 10 can generate ten different phases between times ta to td according to arrangement of the first current I1 and the second current I2. However, since the phase generator 10 generates different phases with a current steering approach, it is rather power-consuming. Therefore, a solution for solving the power-consuming problem of a phase generator in a mixing signal field is in need.

PHASE GENERATING APPARATUS AND METHOD THEREOF

CROSS REFERENCE TO RELATED PATENT APPLICATION

This patent application is based on Taiwan, R.O.C. patent application No. 981411134, filed on Dec. 2, 2009.

FIELD OF THE INVENTION

The present invention relates to a phase generating apparatus and a method thereof, and more particularly, to a digital phase generating apparatus and a method thereof.

BACKGROUND OF THE INVENTION

FIG. 1 shows a schematic diagram of a conventional phase generator 10. For example, the phase generator 10 can be a phase digital-to-analog converter (DAC). Generally, the phase generator 10 generates a phase with an analog approach. More specifically, the phase generator 10 interpolates an output clock CLK2 having a novel phase by two differential input clocks (CLK0+, CKL0−, CLK+ and CLK1−) which have different phases. The phase generator 10 comprises a first differential pair transistors M1 and M2, a second differential pair transistors M3 and M4, a first load 12, a second load 14, a first reference current source 16, and a second reference current source 18. Gate ends Na and Nb of the first differential pair transistors M1 and M2 are respectively for receiving a first positive input clock CLK0+ and a first negative input clock CLK0− of the first differential clock. Gate ends Nc and Nd of the second differential pair transistors M3 and M4 are respectively for receiving a second positive input clock CLK1+ and a second negative input clock CLK1− of the second differential clock. The first reference current source 16 and the second reference current source 18 respectively provide a first current I1 and a second current I2 to the first differential pair transistors M1 and M3 and the second differential pair transistors M3 and M4. It is to be noted that, connection relationships between components of the phase generator 10 are shown in FIG. 1, and shall not be described for brevity.

The phase generator 10 interpolates an output clock CLK2 having a novel phase according to a relationship between the first current I1 and the second current I2. FIG. 2 shows a timing sequence of the differential input clocks (CLK0+, CLK0−, CLK1+, CLK1−) and the output clock (CLK2+, CLK2−) generated by the phase generator 10. The first positive input clock CLK0+ and the first negative input clock CLK0− are respectively inputted at the input gate ends Na and Nb at a time point ta, and the second positive input clock CLK1+ and the second negative input clock CLK1− are respectively inputted at the gate ends Nc and Nd at a time point td. Supposing that the first current I1 and the second current I2 are respectively divided into ten equal portions, when a ratio between the first current I1 and the second current I2 is 5:5, a phase of the output clock (CLK2+, CLK2−) is a middle value between that of the first differential input clock (CLK0+, CLK0−) and a second differential input clock (CLK+, CLK1−), i.e., a transition of the output clock (CLK2+, CLK2−) is at a time point tc. When the ratio between the first current I1 and the second current I2 is 9:1, the transition of the output clock (CLK2+, CLK2−) is at a time point tb. In other words, the phase of the output clock (CLK2+, CLK2−) becomes more approximate to that of the first differential input clock (CLK0+, CLK0−) as the first

SUMMARY OF THE INVENTION

Therefore, one object of the present invention is to provide a digital phase generating apparatus and a method thereof.

According to an embodiment of the present invention, a phase generating apparatus comprises a phase selecting unit and a phase generating unit. The phase selecting unit selects one of a plurality of input clocks according to a portion of bits of a digital signal to generate a reference clock, and each of the input clocks respectively has a different phase. The phase generating unit divides a frequency of the reference clock, and selectively delays the frequency-divided reference clock according another portion of bits of the digital signal to generate the output clock.

According to a second embodiment, a phase generating method is for generating an output clock having a desired phase according to a digital signal. The method comprises providing a plurality of input clocks, and selecting one of the input clocks according to a portion of bits of the digital signal to generate a reference clock, with each of the input clocks having a different phase; dividing a frequency of the reference clock to generate a frequency-divided reference clock; and selectively delaying the frequency-divided reference clock according to another portion of bits of the digital signal to generate the output clock.

DETAILED DESCRIPTION OF THE PREFERRED EMBODIMENT

Figure 3:
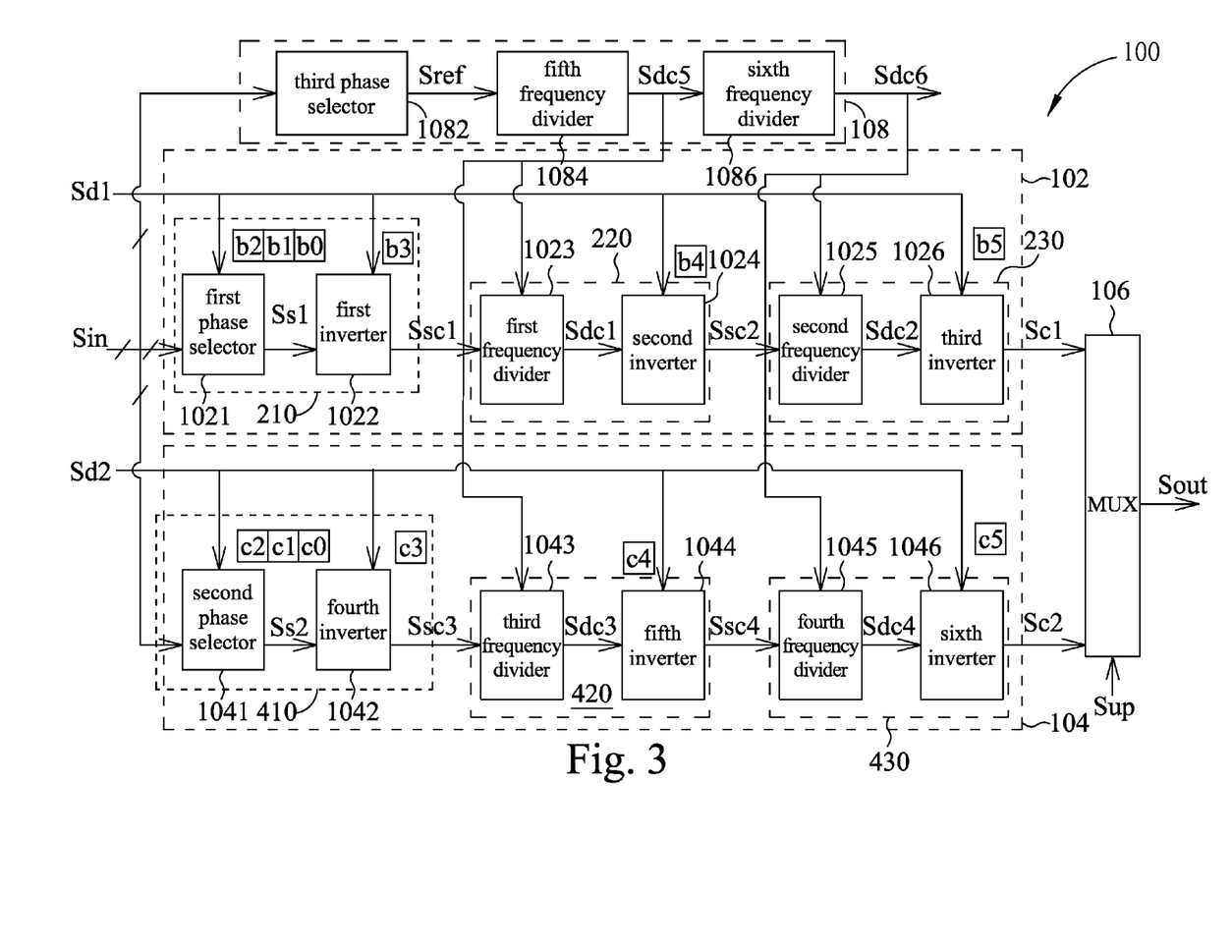
FIG. 3 is a schematic diagram of a phase generating apparatus in accordance with an embodiment of the present invention.

FIG. 3 shows a schematic diagram of a phase generating apparatus 100 in accordance with an embodiment of the present invention. The phase generating apparatus 100 converts a digital signal to an output clock Sout having a specific phase by a plurality of input clocks Sin, and the specific phase corresponds to the digital signal. The plurality of input clocks Sin have different input phases each having an approximately identical phase difference between adjacent input clocks Sin. For example, suppose that there are eight input clocks Sin (i.e., Sin1 to Sin8), which represent eight different input phases. Therefore, in order to more clearly understand of the spirit of the present invention, eight input clocks Sin having different phases and an output clock Sout having a specific phase generated according to a six-bit digital signal (i.e., (b5, b4, b3, b2, b1, b0)) are taken as an example in the following description of the phase generating apparatus 100.

In this embodiment, the phase generating apparatus 100 comprises a first clock generator 102, a second clock generator 104, a selecting circuit 106, and a standard phase generating circuit 108. The first clock generator 102 generates a first output clock Sc1 having a first output phase P1 according to the input clocks Sin and a first digital signal Sd1. The second clock generator 104 generates a second output clock Sc2 having a second output phase according to the input clocks Sin and a second digital signal Sd2. The selecting circuit 106 coupled to the first clock generator 102 and the second clock generator 104 selects one of the first output clock Sc1 and the second output clock Sc2 to be the output clock Sout according to a selection signal Sup. The standard phase generating circuit 108 provides at least one standard phase to the first clock generating apparatus 102 and the second clock generating apparatus 104 for generating the first output phase P1 and the second output phase P2. In this embodiment, the second output clock Sc2 generated by the second clock generator 104 is the current output clock Sout of the phase generating apparatus 100, and the first output clock Sc1 generated by the first clock generator 102 is the next output clock Sout of the phase generating apparatus 100. In other words, the selection circuit 106 is for switching the second output clock Sc2 serving as the current output clock Sout to the first output clock Sc2 serving as the next output clock Sout according to the selection signal Sup.

The first clock generator 102 comprises a first phase selecting unit 210, a first phase generating unit 220, and a second phase generating unit 230. The first phase selecting unit 210 selects one of the input clocks Sin according to a portion of bits of the first digital signal Sd1 to generate a reference clock (i.e., the first clock Ssc1 of the embodiment in FIG. 3). The first phase generating unit 220 first divides the frequency of the reference clock, and then selectively delays the frequency-divided frequency clock according to another portion of bits of the first digital signal Sd1. The second phase generating unit 230 divides the frequency of an output clock of the first phase generating unit 220, and selectively delays the frequency-divided output clock of the first phase generating unit 220 according to further another portion of bits of the first digital signal Sd1. In the embodiment shown in FIG. 3, the first phase selecting unit 210 comprises a first phase selector 1021 and a first inverter 1022. The first phase generating unit 220 comprises a first frequency divider 1023 and a second inverter 1024. The second phase generating unit 230 comprises a second frequency divider 1025 and a third inverter 1026. The first inverter 1022, the second inverter 1024, and the third inverter 1026 are for delaying a phase by 180 degrees. The first phase selector 1021 selects and outputs a first selected input clock Ss1 having a first corresponding phase Ps1 from the input clocks Sin according to the digital signal (b5, b4, b3, b2, b1, b0), where b5 is a most significant bit (MSB) of the digital signal (b5, b4, b3, b2, b1, b0), and b0 is a least significant bit (LSB) of the digital signal (b5, b4, b3, b2, b1, b0), and so on. Further, the first phase selector 1021 selects one of the input clocks Sin as the first selected input clock Ss1 according to a first bit set of the digital signal (b5, b4, b3, b2, b1, b0). The first inverter 1022 coupled to the first phase selector 1021 selectively phase-inverts the first selected input clock Ss1 according to a second bit set of the digital signal (b5, b4, b3, b2, b1, b0) to generate a first clock Ssc1. In the present invention, the first bit set comprises at least one LSB of the digital signal (b5, b4, b3, b2, b1, b0), and the first inverter 1022 selectively performs phase inversion according to at least one LSB of the second bit set. For example, in this embodiment, the first bit set comprises bits (b2, b1, b0) of the digital signal (b5, b4, b3, b2, b1, b0). Since the eight input clocks Sin have eight different input phases, the first phase selector 1021 selects one input clock Sin corresponding to bits (b2, b1, b0). The second bit set is (b3) of the digital signal (b5, b4, b3, b2, b1, b0). When the bit b3 is a high-level bit, the first inverter 1021 performs phase inversion on the first selected input clock Ss1, and generates the first clock Ssc1. On the contrary, when the bit b3 is a low-level bit, the first inverter 1021 directly outputs the selected input clock Ss1 as the first clock Ssc1 instead of performing phase inversion.

The first frequency divider 1023 coupled to the first inverter 1022 divides the frequency of the first clock Ssc1 to generate a first frequency-divided clock Sdc1. The second inverter 1024 coupled to the first frequency divider 1023 selectively inverts the phase of the first frequency-divided clock Sdc1 according to the bit b4 of the digital signal (b5, b4, b3, b2, b1, b0) to generate a second clock Ssc2 having a second phase Ps2. When the second inverter 1024 does not phase-invert the first frequency-divided clock Sdc1, the first frequency-divided clock Sdc1 serves as the second clock Ssc2. When the second inverter 1024 inverts the phase of the first frequency-divided clock Sdc1, the output clock of the second inverter 1024 serves as the second clock Ssc2. The second frequency divider 1025 divides the frequency of the second clock Ssc2 to generate a second frequency-divided clock Sdc2. The third inverter 1026 coupled to the second frequency divider 1025 selectively inverts the phase of the second frequency-divided clock Sdc2 according to the bit b5 of the digital signal (b5, b4, b3, b2, b1, b0) to generate the first output clock Sc1 having the first output phase P1. When the third inverter 1026 does not invert the phase of the second frequency-divided clock Sdc2, the second frequency-divided clock Sdc2 serves as the first output clock Sc1. When the third inverter 1026 inverts the phase of the second frequency-divided clock Sdc2, the output clock of the third inverter 1026 serves as the first output clock Sc1.

The second clock generator 104 comprises a second phase selecting unit 410, a third phase generating unit 420, and a fourth phase generating unit 430. The second phase selecting unit 410 comprises a second phase selector 1041 and a fourth inverter 1042. The third phase generating unit 420 comprises a third frequency divider 1043 and a fifth inverter 1044. The fourth phase generating unit 430 comprises a fourth frequency divider 1045 and a sixth inverter 1046. The second clock generator 104 generates a second output clock Sc2 according to a digital signal (c5, c4, c3, c2, c1, c0), and a detailed operating principle thereof is identical to that of the foregoing first clock generator 102 and shall not be described for brevity.

Figure 4:
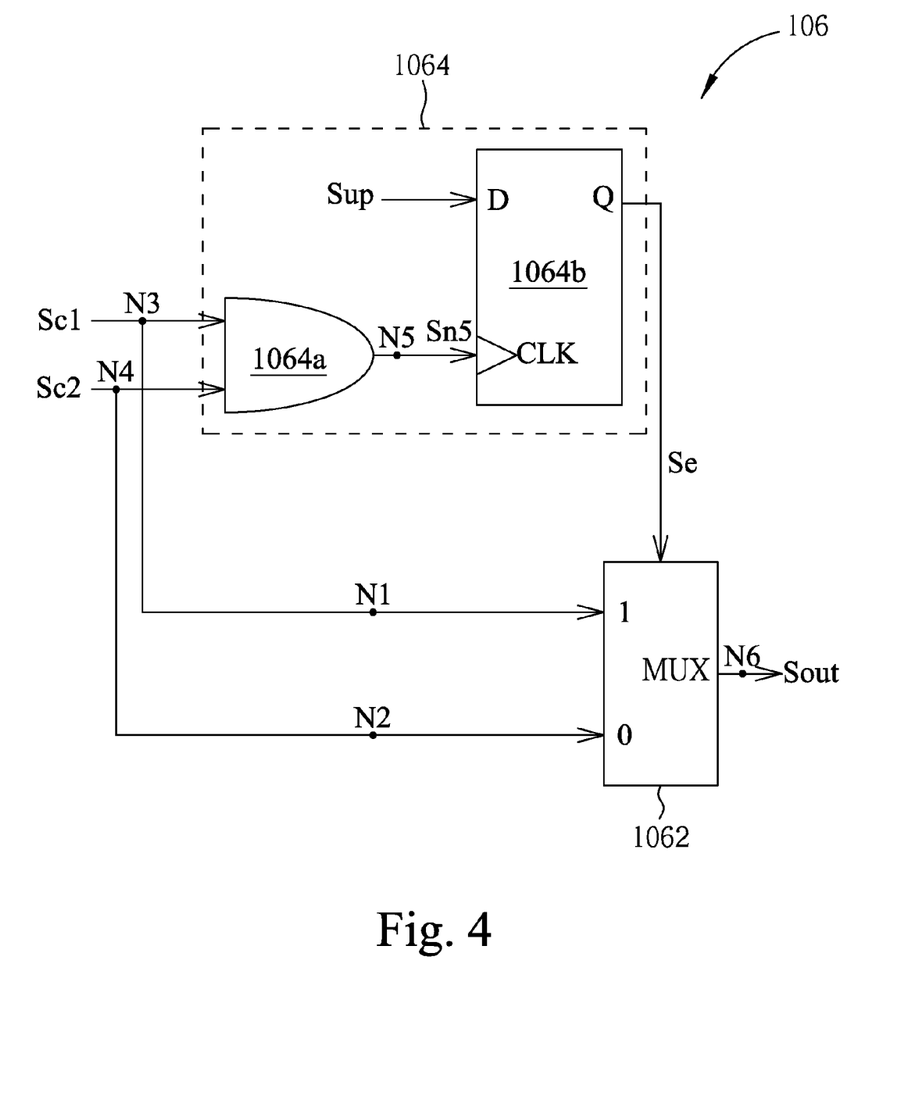
FIG. 4 is a selecting circuit of the phase generating apparatus in FIG. 3 in accordance with an embodiment of the present invention.

FIG. 4 shows a selecting circuit 106 of the phase generating apparatus 100 in FIG. 3 in accordance with an embodiment of the present invention. The selecting circuit 106 comprises a multiplexer 1062 and a control signal generating circuit 1064. The multiplexer 1062 has a first end N1 and a second end N2, which are respectively coupled to the first clock generator 102 and the second clock generator 104, selects one of the first output clock Sc1 and the second output clock Sc2 as the output clock Sout according to a control signal Se. The control signal generating circuit 1064 generates the control signal Se according to the first output clock Sc1, the second output clock Sc2, and the selection signal Sup. In this embodiment, the control signal generating circuit 1064 comprises an AND gate 1064*a* and a register 1064*b*. The AND gate 1064*a* has two input ends N3 and N4 for respectively receiving the first output clock Sc1 and the second output clock Sc2, and an output end N5 for outputting an output signal Sn5. The register 1064*b* has a data input end D for receiving the selection signal Sup, a clock control end CK, coupled to the AND gate 1064*a*, for receiving an output signal Sn5, and a data output end Q for outputting the control signal Se.

In this embodiment, since the digital signal inputted into the phase generating apparatus 100 has 6 bits, the output clock Sout generated by phase generating apparatus 100 has 64 different phase possibilities. In addition, since the phase generating apparatus 100 generates the output clock Sout having a clock frequency of 100 MHz by eight phases of eight input clocks Sin having a clock frequency of 400 MHz, the output clock Sout has 64 different phase possibilities. Therefore, the first frequency divider 1023 and the second frequency divider 1025 respectively frequency divides by two the first clock Ssc1 and the second clock Ssc2. Likewise, the third frequency divider 1043 and the fourth frequency divider 1045 respectively frequency divides by two a third clock Ssc3 and a fourth clock Ssc4. Detailed operations and functions of the phase generating apparatus 100 are further described below.

Figure 5:
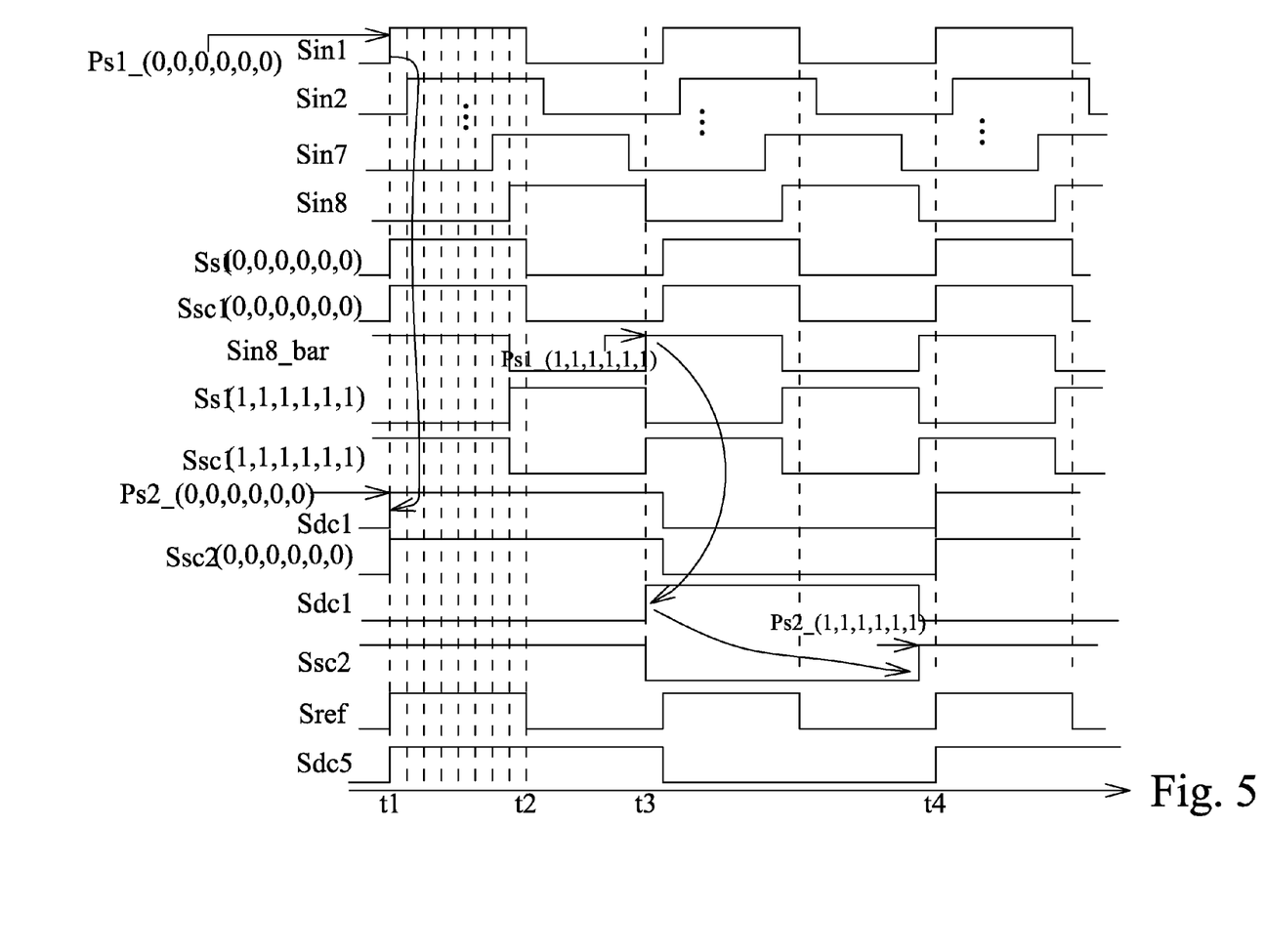
FIG. 5 is a schematic diagram of a timing sequence of a plurality of input clocks, a first selecting input clock, a first clock, a first frequency division clock, a second clock, a reference clock and a fifth frequency division clock of the phase generating apparatus in FIG. 3 in accordance with an embodiment of the present invention.

FIG. 5 shows a schematic diagram of a timing sequence of eight input clocks Sin, the first selected input clock Ss1, the first clock Ssc1, the first frequency-divided clock Sdc1 and the second clock Ssc2 of the phase generating apparatus 100 in FIG. 3 in accordance with an embodiment of the present invention. In order to gain a better understating of the spirit of the present invention, the digital signal (b5, b4, b3, b2, b1, b0) is (0, 0, 0, 0, 0, 0) and (1, 1, 1, 1, 1, 1) for example, supposing that each input clock of the input clocks Sin has a clock frequency of 400 MHz and the first output clock Sc1 has a clock frequency of 100 MHz. Therefore, when the input clocks Sin are inputted into the phase generating apparatus 100, there are eight different phases between a time point t1 to a time point t2, i.e., within half a period of a first input clock Sin1 of the input clocks Sin. When the digital signal (b5, b4, b3, b2, b1, b0) is (0, 0, 0, 0, 0, 0), the first phase selector 1021 selects one of the input clocks Sin according to a first bit set (b2, b1, b0) (i.e., (0, 0, 0)) of the digital signal (0, 0, 0, 0, 0, 0). Since the first bit set (0, 0, 0) corresponds to the first input clock Sin1 of the input clocks Sin, the first phase selector 1021 selects the input clock Sin1 as the first selected input clock Ss1. Then, the first inverter 1022 selectively inverts the phase of the first selected input clock Ss1 according to a second bit set (b3) (i.e., (0)) of the digital signal (0, 0, 0, 0, 0, 0). Since the second bit set (b3) is a low-level bit, the first inverter 1021 directly outputs the first selected input clock Ss1 as the first clock Ssc1 instead of performing phase inversion. Accordingly, the first clock Ssc1 having a first corresponding phase Ps1_(0, 0, 0, 0, 0, 0) (corresponding to a phase at the time point t1) is generated.

On the other hand, when the digital signal (b4, b3, b2, b1, b0) is (1, 1, 1, 1, 1, 1), the first phase selector 1021 selects one of the input clocks Sin according to the first bit set (b2, b1, b0) (i.e., (1, 1, 1). Since the first bit set (1, 1, 1) corresponds to an input clock Sin8 of the input clocks Sin, the first phase selector 1021 selects the input clock Sin8 as the first selected input clock Ss1. The first inverter 1022 selectively inverts the phase of the first selected input clock Ss1 according to a second bit set (b3) (i.e., (1)) of the digital signal (1, 1, 1, 1, 1, 1). Since the second bit set (b3) is a high-level bit, the first inverter 1022 inverts the phase of the first selected input clock Ss1, and outputs the inverted input clock Sin8 (i.e., Sin8_bar) as the first clock Ssc1. Accordingly, the first clock Ssc1 having the first corresponding phase Ps1_(1, 1, 1, 1, 1, 1) (corresponding to a phase at the time point t3) is generated as shown in FIG. 5. In other words, since each of the input clocks Sin may be inverted to respectively generate eight input clocks having other eight phases, the output clock (i.e., the first clock Ssc1) of the first inverter 1022 has 16 different phase possibilities (corresponding to the time point t1).

The first frequency divider 1023 divides the frequency of the first clock Ssc1 by two to generate the first frequency divided clock Sdc1. Taking the digital signal (b5, b4, b3, b2, b1, b0) of (0, 0, 0, 0, 0, 0) as an example, since the bit b4 of the digital signal (b5, b4, b3, b2, b1, b0) is a low-level bit, the second inverter 1024 directly outputs the first frequency-divided clock Sdc1 as the second clock Ssc2 instead of performing phase inversion. Accordingly, the second clock Ssc2 having a second phase Ps2_(0, 0, 0, 0, 0, 0) (corresponding to the time point t1) is generated. Alternatively, taking the digital signal (b5, b4, b3, b2, b1, b0) of (1, 1, 1, 1, 1, 1) as an example, since the bit b4 of the digital signal (b5, b4, b3, b2, b1, b0) is a high-level bit, the second inverter 1024 inverts the phase of the first frequency-divided clock Sdc1 to generate an inverted first frequency-divided clock Sdc1 (i.e., Sdc1_bar) that is outputted as the second clock Ssc2. Accordingly, the second clock Ssc2 generated by the second inverter 1024 has a second phase Ps2_(1, 1, 1, 1, 1, 1) (corresponding to a time point t4). In other words, when the first clock Ssc1 generated by the first inverter 1022 is frequency divided by the first frequency divider 1023, the clock frequency of the first frequency-divided clock Sdc1 is 200 MHz, and the phase of the first frequency-divided clock Sdc1 has 16 different possibilities according to the digital signal (b5, b4, b3, b2, b1, b0). Likewise, since each of the input clocks Sin may be phase inverted by the second inverter 1024 to generate another 16 clocks having 16 different phases, the phase of the second clock Ssc2 outputted by the second inverter 1024 has 32 different phase possibilities. It is to be noted that, the clock frequency of the second clock Ssc2 having the phase of 32 possibilities may be 200 MHz.

Figure 6:
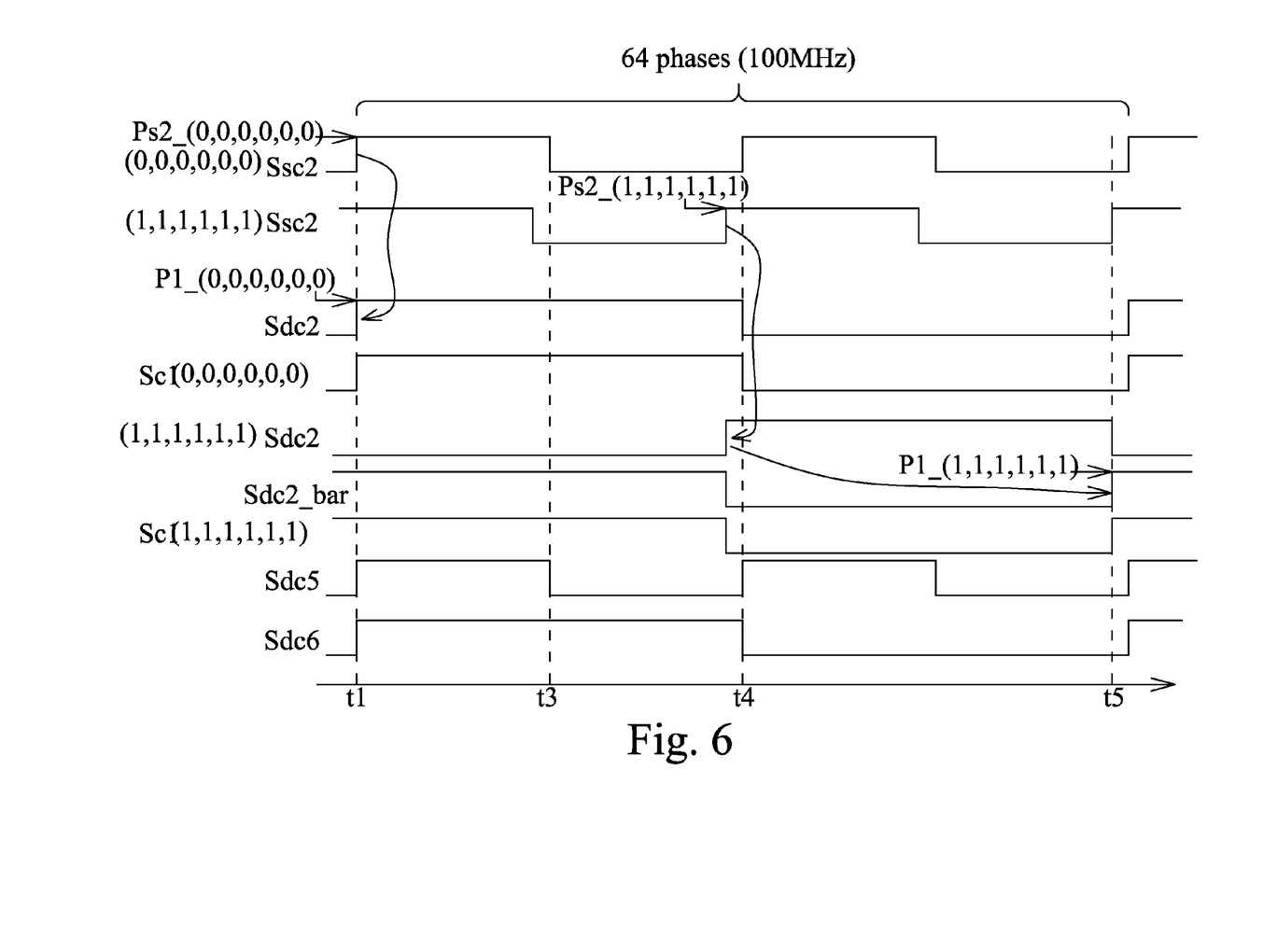
FIG. 6 is a schematic diagram of a timing sequence of a second clock, a second frequency division clock, a first output clock, the fifth frequency division clock and a sixth frequency division clock of the phase generating apparatus in FIG. 3 in accordance with an embodiment of the present invention.

Next, the second clock Ssc2 having the second phase Ps2 and the clock frequency of 200 MHz is transmitted to the second frequency divider 1025 to generate the second frequency divided clock Sdc2. FIG. 6 shows a schematic diagram of a timing sequence of the second clock Ssc2, the second frequency-divided clock Sdc2 and the first output clock Sc1 generated by the phase generating apparatus 100 in FIG. 3. Likewise, taking the digital signal (b5, b4, b3, b2, b1) of (0, 0, 0, 0, 0) as an example, since the bit b5 is a low-level bit, the third inverter 1026 directly outputs the second frequency-divided clock Sdc2 as the first output clock Sc1 instead of performing phase inversion. Accordingly, the first output clock Sc1 having an output phase of P1_(0, 0, 0, 0, 0, 0) (corresponding to the time point t1) is generated. Alternatively, taking the digital signal (b5, b4, b3, b2, b1) of (1, 1, 1, 1, 1, 1) as an example, since the bit b5 is a high-level bit, the third inverter 1026 inverts the phase of the second frequency-divided clock Sdc2 to generate the inverted second frequency-divided clock Sdc2 (i.e., Sdc2_bar) that is outputted as the first output clock Sc1. Accordingly, the first output clock Sc2 having an output phase of P1_(1, 1, 1, 1, 1, 1) (corresponding to a time point P5) is generated. In other words, when the second clock Ssc2 is frequency divided by the third frequency divider 1023, the clock frequency of the second frequency-divided clock Sdc2 is 100 MHz, and the phase of the second frequency-divided clock Sdc2 has 32 possibilities according to the digital signal (b5, b4, b3, b2, b1, b0). Likewise, since each of the input clocks may be phase inverted by the third inverter 1026 to generate another 32 clocks having 32 different phases, the phase of the first output clock Sc1 outputted by the third inverter 1026 has 64 different phase possibilities. It is to be noted that, the clock frequency of the first output clock Sc1 having the phase of 64 possibilities may be 100 MHz. According to the foregoing operations, when a plurality of clocks having different phases is processed by a circuit composed of a frequency divider and an inverter, double phase possibilities are generated. Therefore, a person having ordinary skill in the art will appreciate that the present invention is not limited to the structure of two groups of frequency dividers and inverters (i.e., one group is composed of the first frequency divider 1023 and the second inverter 1024 contained in a dashed line 1022a, and another group is composed of the second frequency divider 1025 and the third inverter 1026 contained in a dashed line 1022b). After proper adjustments, the phase generating apparatus 100 may generate a multiple of a predetermined number of output phases according to the predetermined number of phases.

In addition, the standard phase generating circuit 108 comprises a third phase selector 1082, a fifth frequency divider 1084 and a sixth frequency divider 1086. The third phase selector 1082 selects one of the input clocks Sin as a standard clock Sref. The fifth frequency divider 1084 coupled to third phase selector 1082 divides the frequency of the standard clock Sref to generate a fifth frequency-divided clock Sdc5. The sixth frequency divider 1086 coupled to the fifth frequency divider 1084 divides the frequency of the fifth frequency-divided clock Sdc5 to generate a sixth frequency-divided clock Sdc6. It is to be noted that, in this embodiment, the fifth frequency divider 1084 and the sixth frequency divider 1086 respectively divides by two the standard clock Sref and the fifth frequency-divided clock Sdc5. In addition, in this embodiment, for convenience, the third phase generator 1082 selects the first input clock Sin1 from the input clock Sin as the standard clock Sref; however, this particular configuration should not be construed as limiting the present invention.

The following description is with reference to FIG. 3, FIG. 5 and FIG. 6. When the phase generating apparatus 100 receives the input clocks Sin, since the first input clock Sin1 is the first clock inputted into the phase generating apparatus 100, the third phase selector 1082 regards the phase (corresponding to the time point t1) of the first input clock Sin1 as a reference point of the phase of the first clock Ssc1. In other words, taking the digital signal (b5, b4, b3, b2, b1, b0) of (0, 0, 0, 0, 0, 0) as an example, the first corresponding phase Ps1_(0, 0, 0, 0, 0, 0) of the first clock Ssc1 is synchronous with the phase (i.e., the time point t1) of the standard clock Sref. Taking the digital signal (b5, b4, b3, b2, b1, b0) of (1, 1, 1, 1, 1, 1) as an example, there is a maximum phase difference between the first corresponding phase Ps1_(1, 1, 1, 1, 1, 1) (corresponding to the time point t3) of the first input clock Ssc1 and the phase of the standard clock Sref. Next, the fifth frequency divider 1084 divides the frequency of the standard clock Sref by two to generate the fifth frequency-divided clock Sdc5, and at this point, the first frequency divider 1023 and the second inverter 1024 generates the second clock Ssc2 according to the first clock Ssc1. Since an input clock having an input phase is frequency divided by a frequency divider, a frequency-divided output clock generated by the frequency divider may not have a phase synchronous with the input phase of the input clock, e.g., there may be a phase difference of 180 degrees between them. Therefore, in order to provide the same standard reference phase to the first frequency-divided clock Sdc1 generated by the first frequency divider 1023, the first frequency divider 1023 generates the second clock Ssc2 by regarding the phase of the fifth frequency-divided clock Sdc5 generated by the fifth frequency divider 1084 as a reference point (e.g., the time point t1), such that the phase difference between the standard clock Sref and the first clock Ssc1 approximately equals that between the fifth frequency-divided clock Sdc5 and the second clock Ssc2. Likewise, in order to provide the same standard reference phase to the second frequency-divided clock Sdc2 generated by the second frequency divider 1025, the second frequency divider 1025 generates the first output clock Sc1 by regarding the phase of the sixth frequency-divided clock Sdc6 generated by the sixth frequency divider 1086 as a reference point (e.g., the time point t1), such that the phase difference between the fifth frequency-divided clock Sdc5 and the second clock Ssc2 approximately equals that between the sixth frequency-divided clock Sdc6 and the first output clock Sc1.

Figure 7:
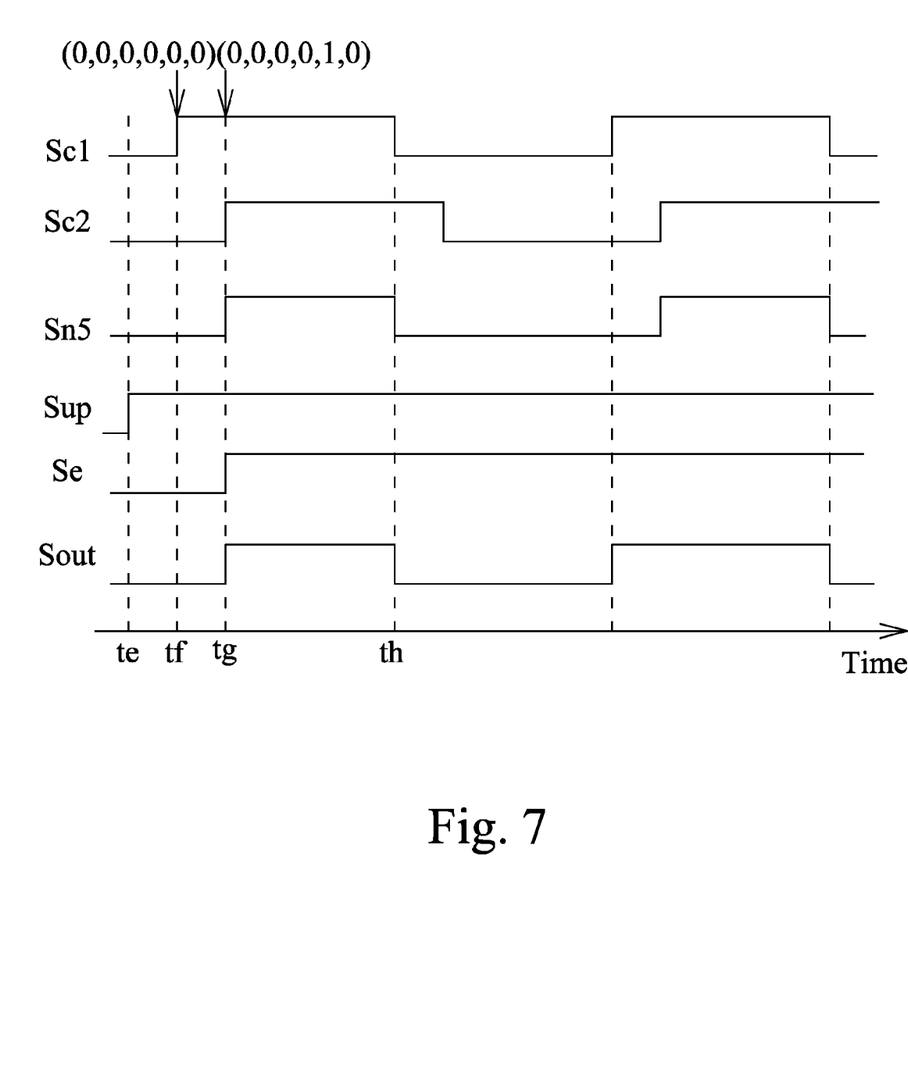
FIG. 7 is a schematic diagram of a timing sequence of the first output clock, a second output clock, an output signal, a selection signal, a control signal and an output clock of the selecting circuit of the phase generating apparatus in FIG. 3 in accordance with an embodiment of the present invention.

The second clock generator 104 of the phase generating apparatus 100 also receives the input clocks Sin, and generates the second output clock Sc2 having the second output phase according to the digital signal (c5, c4, c3, c2, c1, c0) and the input clocks Sin. It is to be noted that the operation of the second clock generator 104 is approximately similar to that of the first clock generator 102, and shall not be described for brevity. However, to more clearly understand the spirit of the present invention, the digital signal (b5, b4, b3, b2, b1, b0) is (0, 0, 0, 0, 0, 0) and the digital signal (c5, c4, c3, c2, c1, c0) is (0, 0, 0, 0, 0, 1, 0) to describe operations of the selecting circuit 106. FIG. 7 shows a schematic diagram of a timing sequence of the first output clock Sc1, the second output clock Sc2, the output signal Sn5, the selection signal Sup, the control signal Se, and the output signal S out. When the current output clock Sout outputted by the phase generating apparatus 100 corresponds to (c5, c4, c3, c2, c1, c0) is (0, 0, 0, 0, 0, 1, 0) (i.e., the current output clock Sout is generated by the second clock generator 104) and the next output clock Sout outputted by the phase generating apparatus 100 corresponds to (b5, b4, b3, b2, b1, b0)=(0, 0, 0, 0, 0, 0), the selection signal Sup switches from level-low to level-high at a time point te. Next, the first output clock Sc1 corresponding to (b5, b4, b3, b2, b1, b0)=(0, 0, 0, 0, 0, 0) is inputted into the multiplexer 1062 and the AND gate 1064a at a time point tf. Then, the first output clock Sc1 and the second output clock Sc2 are simultaneously at level high at a time point tg, and thus the output signal Sn5 switches from level-low to level-high at the time point tg. At this point, the control signal Se of the register 1064b switches from level low to level high at the time point tg. Therefore, at the time point tg, the output clock of the multiplexer 1062 switches from the second output clock Sc2 corresponding to the digital signal (c5, c4, c3, c2, c1, c0)=(0, 0, 0, 0, 0, 1, 0) to the first output clock Sc1 corresponding to the digital signal (b5, b4, b3, b2, b1, b0)=(0, 0, 0, 0, 0, 0, 0). At a time point th, the output signal Sn5 is switched from level-high to level-low, and the control signal Se of the register 1064b maintains at level-high. Accordingly, after the time point tg, the output clock Sout of the phase generating apparatus 100 switches from the second output signal Sc2 to the first output clock Sc1. It is to be noted that, between the time point te and the time point tg, since a voltage at an output end N6 of the multiplexer 1062 stays unchanged and maintains at level-high but not switching from level-high to level-low or from level-low to level-high, the voltage at the output end N6 in fact does not change. In other words, when the output clock Sout of the phase generating apparatus 100 switches from the second output clock Sc2 to the first output clock Sc1 at the time point tg, any glitch that may be present at the output end N6 of the phase generating apparatus 100 is substantially improved.

It is to be noted that a person having ordinary skill in the art will appreciate that the phase generating apparatus 100 is not limited to generating the output clock Sout by the first and second clock generators 102 and 104 and the selecting circuit 106. After proper adjustments, the phase generating apparatus 100 may generate a plurality of output clocks Sout by a plurality of groups of the first and second clock generators 102 and 104 and the selecting circuit 106. In addition, the phase generating apparatus 100 is not limited to generating the output clock Sout by the two-to-one multiplexer 1062 together with the first and second clock generators 102 and 104. After proper adjustments, the phase generating apparatus 100 may generate the output clock Sout by one multiplexer (e.g., a three-to-one multiplexer) together with a plurality of clock generators (e.g., three clock generators). Although the first phase generator 1021 of the phase generating apparatus 100 generates 16 phases within a full period by eight phases within a half period, this particular configuration should not be construed as a limitation of the present invention. The phase generating apparatus 100 may also directly generate the output clock Sout by the input clocks Sin having 16 phases within a full period as shown in FIG. 8.

Figure 8:
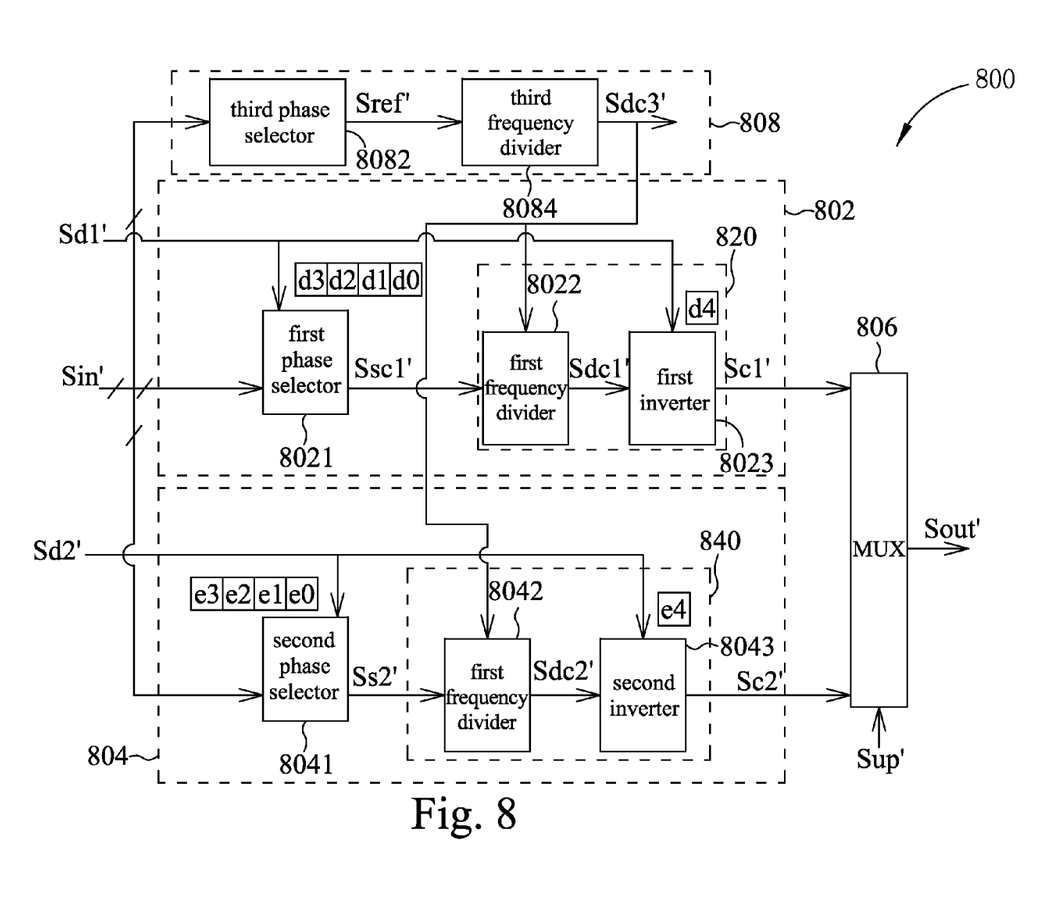
FIG. 8 is a schematic diagram of a phase generating apparatus in accordance with another embodiment of the present invention.

FIG. 8 shows a schematic diagram of a phase generating apparatus 800 in accordance with another embodiment of the present invention. In this embodiment, the phase generating apparatus 800 comprises a first clock generator 802, a second clock generator 804, a selection circuit 806, and a standard phase generating circuit 808. The first clock generator 802 generates a first output clock Sc1' having a first output phase according to the input clocks Sin' and a first digital signal Sd1' (i.e., (d4, d3, d2, d1, d0)). The second clock generator 804 generates a second output clock Sc2' having a second output phase according to the input clocks Sin' and a second digital signal Sd2' (i.e., (e4, e3, e2, e1, e0)). The selection circuit 806, coupled to the first clock generator 802 and the second clock generator 804, selects one of the first digital signal Sc1' and the second digital signal Sc2' respectively generated by the first clock generator 802 and the second clock generator 804 according to a selection signal Sup'. The standard generating circuit 808 provides at least one standard phase to the first clock generator 802 and the second clock generator 804 as a standard phase of a first output phase and a second output phase. In addition, the first clock genitor 802 comprises a first phase selector 8021 and a first phase generating unit 820. The first phase selector 8021 selects a selected input clock Ssc1' having a corresponding phase from the input clocks Sin' according to the first digital signal Sd1'. The phase generating unit 820 comprises a first frequency divider 8022 and a first inverter 8023. The first frequency divider 8022 coupled to the first phase selector 8021 divides the frequency of the selected input clock Ssc1' to generate a first frequency-divided clock Sdc1'. The first inverter 8023 coupled to the first frequency divider 8022 selectively inverts the phase of the first frequency-divided clock Sdc1' according to a bit b4 of the first digital signal Sd1' to generate the first output clock Sc1' having a first output phase P1'. Likewise, the second clock generator 804 comprises a second phase selector 8041 and a second phase generating unit 840. The second phase generating unit 840 comprises a second frequency divider 8042 and a second inverter 8043. In addition, the standard phase generating circuit 808 comprises a third phase selector 8082 for selecting an input clock from the input clocks Sin' as a standard clock Sref'; and a third frequency divider 8084, coupled to the third phase generator 8082, for dividing the frequency of the standard clock Sref' to generate a third frequency-divided clock Sdc3'. The first frequency divider 8022 and the second frequency divider 8042 respectively regard a phase of the third frequency-divided clock Sdc3' as a standard phase for generating the first frequency-divided clock Sdc1' and the second frequency-divided Sdc2'. The selecting circuit 806 switches the second output clock Sc2 serving as the current output clock Sout' to the first output clock Sc1' that is the next output clock Sout'.

Further, in this embodiment, the input clocks Sin' have 16 different phases within a full period, and the first, second and third selectors 8021, 8041 and 8082 of the phase generating apparatus 800 select one of the 16 phases within the full period of the input clock Sin', so as to omit the corresponding first inverter 1022 and the fourth inverter 1042 of the phase generating apparatus 100. For convenience, the phase generating apparatus 800 generates the output clock Sout' having a corresponding phase according to a five-bit digital signal (i.e., the first digital signal Sd1' (d4, d3, d2, d1, d0) and the second digital signal Sd2'(e4, e3, e2, e1, e0)). Four bits (d3, d2, d1, d0) of the first digital signal Sd1' are provided to the first phase selector 8021 for selecting one input clock having a corresponding phase from the 16 input clocks Sin, four bits (e3, e2, e1, e0) of the second digital signal Sd2' are provided to the second phase selector 8041 for selecting another one input clock having a corresponding phase from 16 input clocks Sin', and the bit e4 of the second digital signal Sd2' is provided to the second frequency divider 8042. With reference to the technique of the phase generating apparatus 100, since the digital signal of the phase generating apparatus 100 has five bits, the output clock Sout' generated by the phase generating apparatus 800 has 32 different phase possibilities, and has a clock frequency of 100 MHz (e.g., the input clocks Sin' have a clock frequency of 200 MHz). It is to be noted that operation of the phase generating apparatus 800 is similar to those of the phase generating apparatus 100, and shall not be described for brevity.

In conclusion, the present invention provides a phase generating apparatus realized by digital circuits. As mentioned above, since the phase generating apparatus realized by digital circuits is capable of avoiding conventional current steering circuits, the phase generating apparatuses 100 and 800 according to the present invention can substantially reduce power consumption for operating circuits. Through the selecting circuit 106 and an associated method according to the present invention, the phase generating apparatuses 100 and 800 further address glitches that may occur during operation.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A phase generating apparatus, for generating an output clock having a desired phase according to a digital signal, the apparatus comprising:
a phase selecting unit, selecting one of a plurality of input clocks according to a portion of bits of the digital signal to generate a reference clock, wherein each of the input clocks respectively has a different phase; and
a phase generating unit, for dividing a frequency of the reference clock, and selectively delaying the frequency-divided frequency clock according to another portion of bits of the digital signal to generate the output clock,
wherein the phase generating unit comprises:
a frequency divider, for dividing the frequency of the reference clock; and
a delay unit, for selectively delaying the frequency-divided reference clock according to the another portion of bits of the digital signal to generate the output clock.

2. The phase generating apparatus as claimed in claim 1, wherein the phase selecting unit comprises:
a phase selector, for selecting one of the input clocks according to a portion of the portion of bits of the digital signal; and
a delay unit, for selectively delaying the selected input clock according to another portion of the portion of bits of the digital signal to generate the reference clock.

3. The phase generating apparatus as claimed in claim 1, wherein the phase selecting unit comprises a phase selector, for selecting one of the input clocks as the reference clock according to the portion of bits of the digital signal.

4. The phase generating apparatus as claimed in claim 1, further comprising:
a standard phase selector, for selecting one of the input clocks as a standard clock; and
another frequency divider, for dividing a frequency of the standard clock to generate a frequency-divided standard clock;
wherein, the frequency divider regards a phase of the frequency-divided standard clock as a standard for generating the frequency-divided reference clock.

5. The phase generating apparatus as claimed in claim 1, wherein the delay unit is composed of an inverter.

6. The phase generating apparatus as claimed in claim 1, for further generating another output clock having another desired phase according to another digital signal, the phase generating apparatus further comprising:
another phase selecting unit, for selecting one of the input clocks according to a portion of bits of the another digital signal to generate another reference clock;
another phase generating unit, for dividing a frequency of the another reference clock, and selectively delaying the another frequency-divided reference clock according to another portion of bits of the another digital signal to generate the another output clock; and
a selecting circuit, for selecting one of the output clock and the another output clock according to a selection signal.

7. The phase generating apparatus as claimed in claim 6, wherein the selecting circuit comprises:
a control signal generating circuit, for generating a control signal according to the output clock, the another output clock and the selection signal; and
a multiplexer, for receiving the output clock and the another output clock, and selecting one of the output clock and the another output clock according to the control signal.

8. A phase generating method, for generating an output clock having a desired phase according to a digital signal, the method comprising:
(a) providing a plurality of input clocks, and selecting one of the input clocks according to a portion of bits of the digital signal to generate a reference clock, wherein each of the input clocks respectively has a different phase;
(b) dividing a frequency of the reference clock to generate a frequency-divided reference clock; and
(c) selectively delaying the frequency-divided reference clock according to another portion of bits of the digital signal to generate the output clock,
wherein Step (c) delays the frequency-divided reference clock by an inverter.

9. The method as claimed in claim 8, wherein Step (a) comprises:
selecting one of the input clocks according to a portion of the portion of bits of the digital signal; and
selectively delaying the selected input clock according to another portion of the portion of bits of the digital signal to generate the reference clock.

10. The method as claimed in claim 8, wherein Step (a) selects one of the input clocks as the reference clock according to the portion of bits of the digital signal.

11. The method as claimed in claim 8, further comprising:
selecting one of the input clocks as a standard clock; and
dividing a frequency of the standard clock to generate a frequency-divided standard clock;
wherein, Step (b) regards the frequency-divided standard clock as a standard to generate the frequency-divided reference clock.

12. The method as claimed in claim 8, for generating another output clock having another desired phase according to another digital signal, the method comprising:
selecting one of the input clocks according to a portion of bits of the another digital signal to generate another reference clock;
dividing a frequency of the another reference clock, and selectively delaying the another frequency-divided reference clock according to another portion of bits of the another digital signal to generate the another output clock; and
selecting one of the output clock and the another output clock.

* * * * *